(12) United States Patent
Park et al.

(10) Patent No.: US 9,012,893 B2
(45) Date of Patent: Apr. 21, 2015

(54) DISPLAY APPARATUS AND METHOD OF MANUFACTURING THE SAME

(71) Applicants: Sun Park, Yongin (KR); Yul-Kyu Lee, Yongin (KR); Chun-Gi You, Yongin (KR); Ji-Hoon Song, Yongin (KR)

(72) Inventors: Sun Park, Yongin (KR); Yul-Kyu Lee, Yongin (KR); Chun-Gi You, Yongin (KR); Ji-Hoon Song, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 142 days.

(21) Appl. No.: 13/665,112

(22) Filed: Oct. 31, 2012

(65) Prior Publication Data
US 2014/0014908 A1    Jan. 16, 2014

(30) Foreign Application Priority Data

Jul. 10, 2012  (KR) .................. 10-2012-0075147

(51) Int. Cl.
| H01L 29/08 | (2006.01) |
| H01L 35/24 | (2006.01) |
| H01L 51/00 | (2006.01) |
| H01L 51/52 | (2006.01) |
| H01L 27/32 | (2006.01) |

(52) U.S. Cl.
CPC ........ *H01L 27/3276* (2013.01); *H01L 51/5237* (2013.01)

(58) Field of Classification Search
CPC ............ H01L 27/3276; H01L 51/5237; G02F 2201/48
USPC ................................................ 257/40, E51.02
See application file for complete search history.

(56) References Cited

U.S. PATENT DOCUMENTS

| 2007/0188675 A1* | 8/2007 | Tsubokura et al. ............. 349/58 |
| 2009/0073342 A1* | 3/2009 | Jung et al. ...................... 349/60 |
| 2010/0096749 A1 | 4/2010 | Kim et al. |

FOREIGN PATENT DOCUMENTS

| JP | 11-212102 | 8/1999 |
| KR | 10-2010-0043920 | 4/2010 |
| KR | 10-2011-0119428 A | 11/2011 |

* cited by examiner

*Primary Examiner* — Telly Green
(74) *Attorney, Agent, or Firm* — Lee & Morse, P.C.

(57) ABSTRACT

A display apparatus includes a substrate including a display area, an encapsulation member facing the substrate, a pad unit around the display area of the substrate, the pad unit including a contact area and an exposure area that is spaced apart from the contact area, and a flexible printed circuit (FPC) that is connected to the contact area of the pad unit and is curved towards the encapsulation member.

14 Claims, 10 Drawing Sheets

DISPLAY APPARATUS AND METHOD OF MANUFACTURING THE SAME

CROSS-REFERENCE TO RELATED APPLICATION

This application claims the benefit under 35 U.S.C. §119 of Korean Patent Application No. 10-2012-0075147, filed on Jul. 10, 2012, in the Korean Intellectual Property Office, the disclosure of which is incorporated herein in its entirety by reference.

BACKGROUND

1. Field

Embodiments relate to a display apparatus and a method of manufacturing the same, and more particularly, to a display apparatus with improved user convenience and improved electrical characteristics and a method of manufacturing the display apparatus.

2. Description of the Related Art

Recently, display apparatuses have been replaced with portable thin film flat panel display apparatuses. A display apparatus includes a circuit substrate such as a printed circuit board (PCB) that supplies power for driving the display apparatus or generates an electrical signal, and includes a pad unit that transmits the electrical signal generated by the PCB. The pad unit and the PCB may be connected to each other by a flexible printed circuit (FPC).

SUMMARY

Embodiments are directed to a display apparatus including a substrate including a display area; an encapsulation member facing the substrate; a pad unit around the display area of the substrate, the pad unit including a contact area and an exposure area that is spaced apart from the contact area; and a flexible printed circuit (FPC) that is connected to the contact area of the pad unit and is curved towards the encapsulation member.

A disconnection area may be arranged between the contact area and the exposure area of the pad unit such that the contact area is spaced apart from the exposure area.

The contact area may be farther away from an edge of the substrate than the exposure area.

The exposure area may be spaced apart and in a non-overlapping relationship with the FPC.

Side surfaces of the contact area and the exposure area which face each other may be in a form of cutting surfaces.

The display apparatus may further include a printed circuit board (PCB) that is connected to the FPC and faces the encapsulation member.

The PCB may be within an extension line of a side surface of the substrate.

The FPC may be within an extension line of a side surface of the substrate.

An edge of the exposure area may be parallel to an edge of the substrate.

At least one of the contact area and the exposure area of the pad unit may be in a form of multi-layers.

At least a first electrode, a second electrode, and an intermediate layer that is between the first electrode and the second electrode and that includes an organic emission layer, may be on the display area of the substrate.

The display apparatus may further include a thin film transistor that is electrically connected to the first electrode and that includes an active layer, a gate electrode, a source electrode, and a drain electrode.

The display apparatus may further include a thin film transistor that is electrically connected to the first electrode and that includes an active layer, a gate electrode, a source electrode, and a drain electrode, wherein the first electrode is at a same layer level as the gate electrode.

At least one of the contact area and the exposure area of the pad unit may be in a form of multi-layers, wherein at least one of the multi-layers is at the same layer level as the gate electrode, and at least another layer of the multi-layers is on a same layer level as the source electrode and the drain electrode so as to contact a layer at the same layer level as the gate electrode.

According to another aspect, there is provided a method of manufacturing a display apparatus, the method including preparing a substrate including a display area and an encapsulation member facing the substrate; forming a pad unit on the substrate, the pad unit being disposed around the display area and including a contact area and an exposure area; and positioning a flexible printed circuit (FPC) that is connected to the contact area of the pad unit and is curved towards the encapsulation member.

The forming of the pad unit may include forming a disconnection area by performing a cutting process between the contact area and the exposure area so as to space the contact area and the exposure area apart from each other.

The cutting process may be performed using laser beams.

The positioning of the FPC may be performed after the contact area and the exposure area of the pad unit are formed.

In the positioning of the FPC, the FPC may be spaced apart from a side surface of the substrate by being curved within an extension line of the side surface of the substrate.

The method may further include positioning a printed circuit board (PCB) so as to be connected to the FPC and face the encapsulation member.

BRIEF DESCRIPTION OF THE DRAWINGS

Features will become more apparent by describing in detail exemplary embodiments thereof with reference to the attached drawings in which.

DETAILED DESCRIPTION

Exemplary embodiments will now be described in detail with reference to the accompanying drawings. Expressions such as "at least one of," when preceding a list of elements, modify the entire list of elements and do not modify the individual elements of the list.

Figure 1:
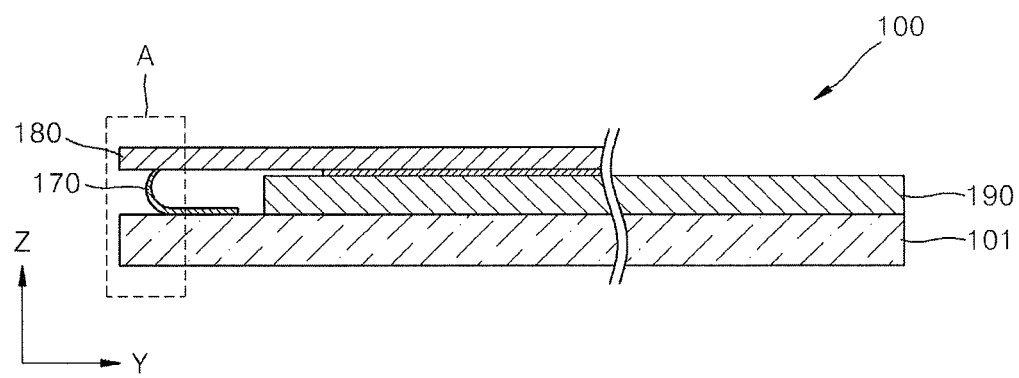
FIG. 1 is a schematic cross-sectional view illustrating a structure of a display apparatus according to an embodiment.
Figure 2:
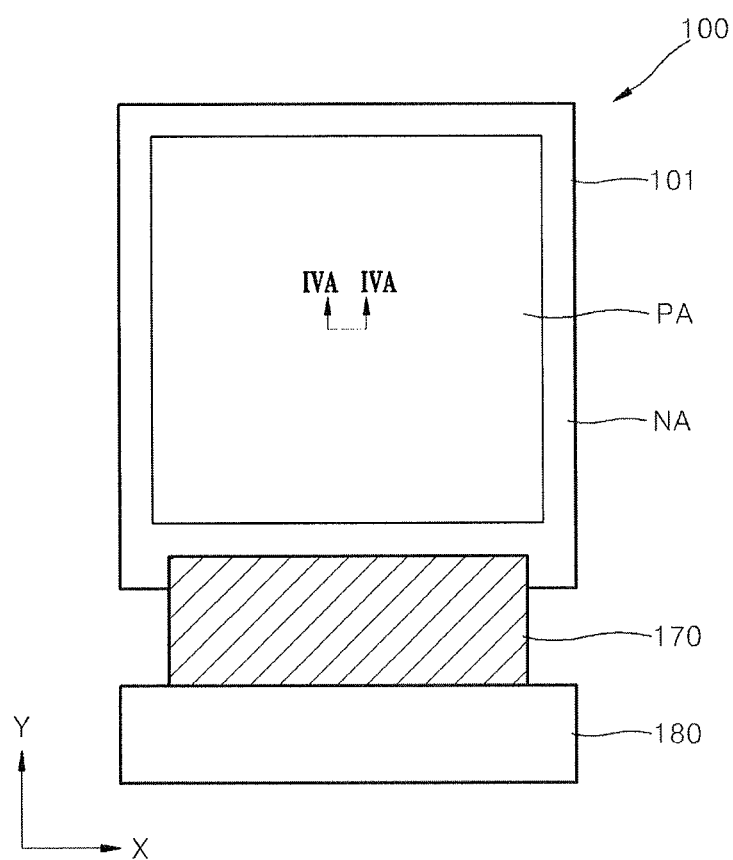
FIG. 2 is a schematic plan view illustrating elements of the display apparatus of FIG. 1, according to an embodiment.
Figure 3:
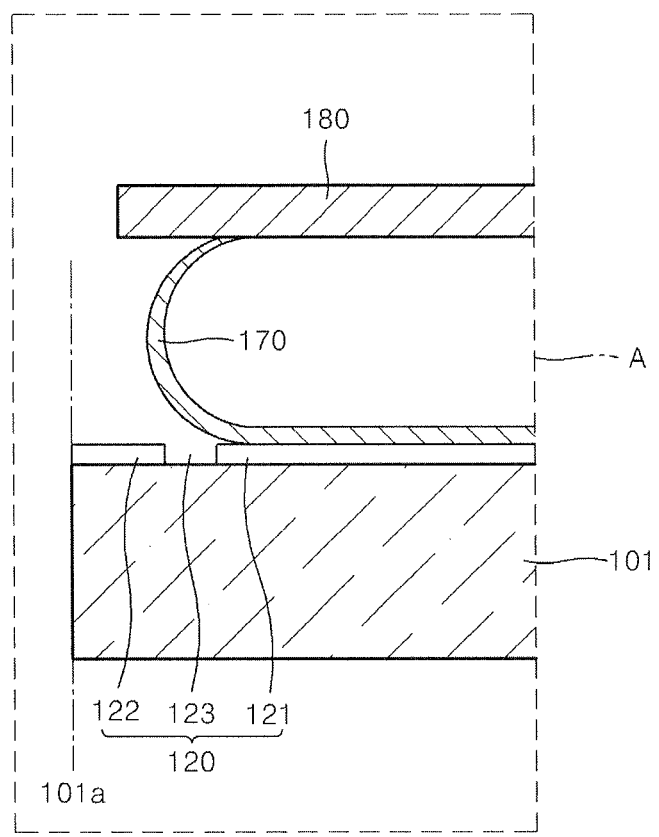
FIG. 3 is an enlarged cross-sectional view of region A illustrated in FIG. 1, according to an embodiment.
Figure 4:
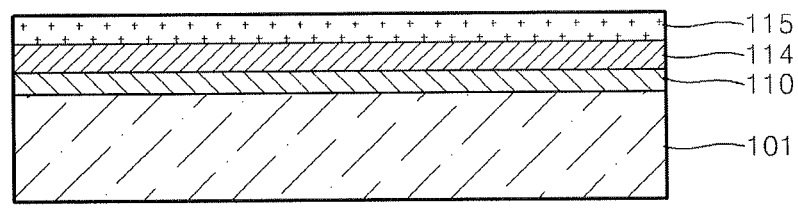
FIG. 4 is a cross-sectional view taken along line IV-IV of FIG. 2, according to an embodiment.

FIG. 1 is a schematic cross-sectional view illustrating a structure of a display apparatus 100 according to an embodiment. FIG. 2 is a schematic plan view illustrating elements of the display apparatus 100 of FIG. 1, according to an embodiment. FIG. 3 is an enlarged cross-sectional view of region A illustrated in FIG. 1, according to an embodiment. FIG. 4 is a cross-sectional view taken along line IV-IV of FIG. 2, according to an embodiment.

Referring to FIGS. 1 through 4, the display apparatus 100 includes a substrate 101 including a display area PA, an encapsulation member 190, a flexible printed circuit (FPC) 170, and a printed circuit board (PCB) 180.

The substrate 101 may be transparent glass mainly formed of $SiO_2$. In other implementations, the substrate 101 may be formed of a transparent plastic material. For example, the plastic material may be at least one selected from a variety of organic materials.

The encapsulation member 190 may be formed of glass, like the substrate 101.

In addition, the encapsulation member 190 may be formed of plastic or a thin-film metal, or may be formed by stacking organic layers or inorganic layers.

The display area PA of the substrate 101 is an area for displaying an image. The display area PA may include various elements, which will be described below in detail. A non-display area NA is formed around the display area PA.

A pad unit 120 is formed on the non-display area NA, as illustrated in FIG. 3. Although not illustrated in the drawings, the pad unit 120 transmits an electrical signal generated by the PCB 180 to the display area PA.

In an embodiment, the pad unit 120 is electrically connected to the FPC 170, and the FPC 170 is connected to the PCB 180. The PCB 180, which has a variety of circuit patterns, may supply a power and generate a variety of signals for driving the display apparatus 100. The electrical signal generated by the PCB 180 is transmitted to the pad unit 120 via the FPC 170, and then transmitted to the display area PA to drive the display area PA.

In addition, the pad unit 120 may include a plurality of wires. For example, in FIG. 3, one of the plurality of wires of the pad unit 120 is illustrated.

The pad unit 120 includes a contact area 121, an exposure area 122, and a disconnection area 123.

The contact area 121 contacts the FPC 170 and is an area through which the signal generated by the PCB 180 is transmitted to the display area PA after passing through the FPC 170. The exposure area 122 is spaced apart from the contact area 121 by the disconnection area 123. That is, the disconnection area 123 is an opening that disconnects the exposure area 122 and the contact area 121. Thus, although not illustrated in the drawings, the exposure area 122 and the contact area 121 are spaced apart from each other on the entire area of the substrate 101.

The FPC 170 electrically connects the contact area 121 and the PCB 180. In particular, a first end of the FPC 170 is connected to the contact area 121 of the pad unit 120 and a second end of the FPC 170 is connected to the PCB 180.

As illustrated in FIG. 1, the FPC 170 has a curved shape. That is, as illustrated in FIG. 1, the substrate 101, the FPC 170, and the PCB 180 are connected to one another in this order, the FPC 170 is bent, and the PCB 180 is disposed on a top surface of the encapsulation member 190, i.e., a surface of the encapsulation member 190 that is opposite to a surface of the encapsulation member 190 facing the substrate 1. Referring to FIG. 1, the PCB 180 and the encapsulation member 190 may be adhered to each other by an adhesive layer or the like. In other implementations, no member may be disposed between the PCB 180 and the encapsulation member 190.

The FPC 170 is curved in an upper side direction, i.e., towards the encapsulation member 190, and thus, a side surface of the substrate 101 is not covered by the FPC 170 and is exposed. In addition, the exposure area 122 and the disconnection area 123 of the pad unit 120 are not covered by the FPC 170 and are exposed. The exposure area 122 of the pad unit 120 may be spaced apart from the FPC 170 so as to prevent external moisture from the exposure area 122 from permeating into the FPC 170.

The FPC 170 is formed within an extension line 101a of the side surface of the substrate 101. In addition, the PCB 180 connected to the FPC 170 is also formed within the extension line 101a of the side surface of the substrate 101. That is, the FPC 170 and the PCB 180 are disposed within the edge of the substrate 101, and thus, the size of the display area PA of the display apparatus 100 may be maintained and the width of the display apparatus 100 may be minimized.

The display area PA will now be described with reference to FIG. 4.

A first electrode 110 is formed on the substrate 101. The first electrode 110 may include ITO, IZO, ZnO, or $In_2O_3$. Also, according to the use purpose and design conditions, the first electrode 110 may further include a reflective layer formed of silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), or calcium (Ca).

Although not illustrated in FIG. 4, a buffer layer (not shown) may be formed between the substrate 101 and the first electrode 110. The buffer layer (not shown) prevents the permeation of impurity elements from the substrate 101 and provides a planar surface on the substrate 101. Thus, the buffer layer may be formed of various materials that perform such functions. For example, the buffer layer may include an inorganic material such as silicon oxide, silicon nitride, silicon oxynitride, aluminum oxide, aluminum nitride, titanium oxide, or titanium nitride, or an organic material such as polyimide, polyester, or acryl. In an embodiment, the buffer layer may be formed as stacked layers of these materials.

An intermediate layer 114 is formed on the first electrode 110. The intermediate layer 114 includes an organic emission layer (EML) to emit visible light. The organic EML of the intermediate layer 114 may be a low-molecular weight organic layer or a high-molecular weight organic layer. When the organic EML of the intermediate layer 114 is formed as a low-molecular weight organic layer, the intermediate layer 114 may include a hole injection layer (HIL), a hole transport layer (HTL), an organic EML, an electron transport layer (ETL), and an electron injection layer (EIL).

The HIL may be formed of a phthalocyanine compound such as copper phthalocyanine or starburst-type amines such as TCTA, m-MTDATA, and m-MTDAPB.

The HTL may be formed of N,N-bis(3-methylphenyl)-N,N'-diphenyl-[1,1-biphenyl]-4,4'-diamine (TPD) or N,N-di(naphthalene-1-yl)-N,N'-diphenyl benzidine ($\alpha$-NPD).

The EIL may be formed using a material such as LiF, NaCl, CsF, $Li_2O$, BaO, Liq, or the like.

The ETL may be formed of $Alq_3$.

The organic EML may include a variety of host materials and a variety of dopant materials.

A second electrode 115 is formed on the intermediate layer 114. The second electrode 115 may be formed of a metal such as Ag, Mg, Al, Pt, Pd, Au, Ni, Nd, Ir, Cr, Li, or Ca.

Then, the encapsulation member 190 is disposed on the second electrode 115, as illustrated in FIG. 1.

Various kinds of display apparatuses may be used. As an example of the display apparatus 100, an organic light-emitting display device including the first electrode 110, the intermediate layer 114 including an organic EML, and the second electrode 115 has been described.

In the display apparatus 100 according to the present embodiment, the FPC 170 is curved in an upper side direction, i.e., towards the encapsulation member 190. In addition, the FPC 170 is formed within the side surface of the substrate 101 by being curved. Accordingly, the size of the display area PA of the display apparatus 100 may be maintained and the width of the display apparatus 100 may be minimized. That is, the display apparatus 100 that maintains its size, has a display area PA with a minimized width, and provides user convenience may be easily manufactured.

The pad unit 120 of the display apparatus 100 includes the contact area 121 that contacts the FPC 170. In this regard, the contact area 121 is overall spaced apart from the exposure area 122 by the disconnection area 123. The FPC 170 may be curved in an upper side direction. If the pad unit 120 were to be exposed to the outside, the pad unit 120 could be damaged by external moisture or serve as a path for permeation of external moisture into the display area PA. In the present embodiment, the exposure area 122 disposed on the edge of the substrate 101 and the contact area 121 that contacts the FPC 170 are overall spaced apart from each other by the disconnection area 123, and thus, even though external moisture permeates into the exposure area 122, the moisture is blocked by the disconnection area 123 to not permeate into the contact area 121. That is, no moisture permeates into the contact area 121, the FPC 170, the display area PA, and the PCB 180. Thus, the permeation of the moisture through the pad unit 120 is easily prevented to easily improve the electrical characteristics of the display apparatus 100.

Figure 5:
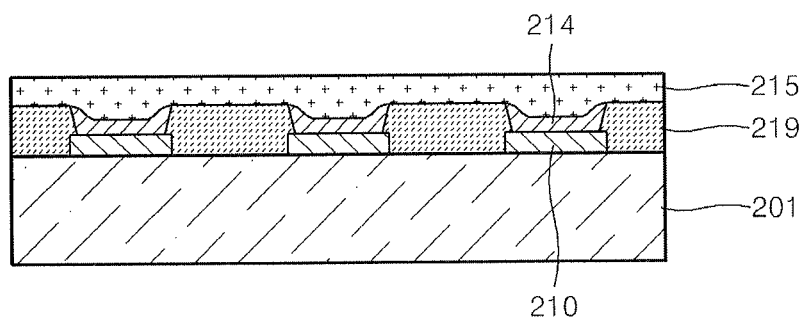
FIG. 5 is a cross-sectional view illustrating a display area of a display apparatus, according to another embodiment.

FIG. 5 is a cross-sectional view illustrating a display area PA of a display apparatus, according to another embodiment.

Referring to FIG. 5, first electrodes 210, a pixel-defining layer 219, intermediate layers 214, and a second electrode 215 are sequentially formed on the display area PA of a substrate 201. Each element will now be described in detail. For the convenience of explanation, elements that are different from those of the display apparatus 100 of the previous embodiment will now be described.

The first electrodes 210 are formed on the substrate 201. The pixel-defining layer 219 is formed on the substrate 201 and covers portions of each first electrode 210, wherein the pixel-defining layer 219 is formed using an insulating material. In this regard, the pixel-defining layer 219 has openings that partially expose top surfaces of the first electrodes 210.

The intermediate layers 214 are formed on the exposed top surfaces of the first electrodes 210, respectively. Each intermediate layer 214 includes an organic EML to emit visible rays.

The second electrode 215 is formed on the intermediate layers 214. An encapsulation member (not shown) is formed on the second electrode 215.

Figure 6:
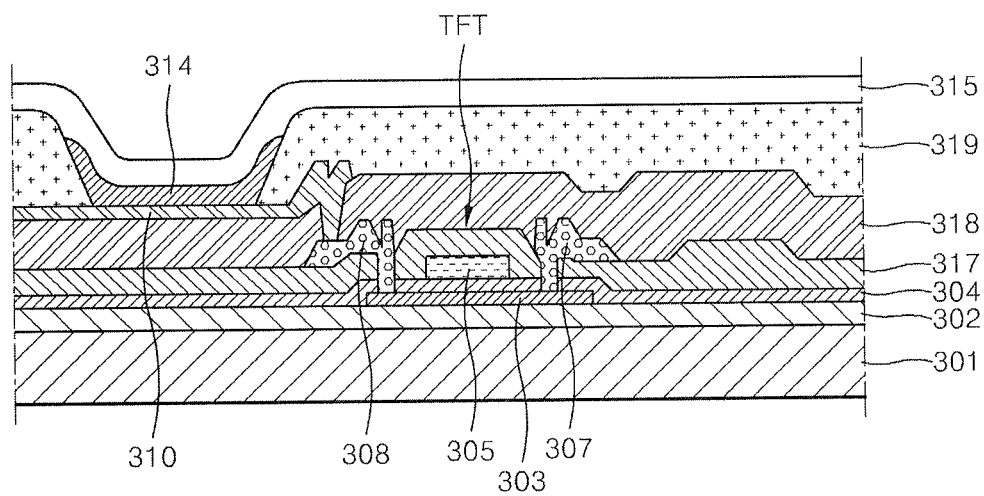
FIG. 6 is a cross-sectional view illustrating a display area of a display apparatus, according to another embodiment.

FIG. 6 is a cross-sectional view illustrating a display area PA of a display apparatus, according to another embodiment.

Referring to FIG. 6, a thin film transistor TFT is formed on the display area PA of a substrate 301. The TFT includes an active layer 303, a gate electrode 305, a source electrode 307, and a drain electrode 308.

A buffer layer 302 is formed on the substrate 301. A detailed description of nonessential elements is not provided herein. The active layer 303 is formed in a predetermined pattern on the buffer layer 302. The active layer 303 may be formed of an inorganic semiconductor, such as amorphous silicon or polysilicon, or an organic semiconductor, and may include a source area, a drain area, and a channel area. The source and drain areas of the active layer 303 may be formed by doping the active layer 303 with a Group III or V element after the active layer 303 is formed using amorphous silicon or polysilicon.

A gate insulating layer 304 is formed on the active layer 303, and the gate electrode 305 is formed on a predetermined area of the gate insulating layer 304. The gate insulating layer 304 insulates the gate electrode 305 from the active layer 303, and may be formed of an organic material or an inorganic material, such as $SiN_x$ or $SiO_2$.

Various materials may be used to form the gate electrode 305 in consideration of an adhesion property with respect to an adjacent layer, a planarization property, an electric resistance, and processability. For example, the gate electrode 305 may include Au, Ag, Cu, Ni, Pt, Pd, Al, Mo, or an alloy, such as an Al:Nd alloy or an Mo:W alloy.

An insulating interlayer 317 is formed on the gate electrode 305. The insulating interlayer 317 and the gate insulating layer 304 are formed so as to expose the source and drain areas of the active layer 303, and the source electrode 307 and the drain electrode 308 are formed so as to respectively contact the exposed source and drain areas of the active layer 303. The source electrode 307 and the drain electrode 308 may each be formed of various conductive materials and may have a single- or multi-layer structure.

A passivation layer 318 is formed on the TFT. In particular, the passivation layer 318 is formed on the source electrode 307 and the drain electrode 308.

The passivation layer 318 is formed so as to expose a predetermined area of the drain electrode 308, and a first electrode 310 is formed so as to be connected to the exposed portion of the drain electrode 308.

A pixel-defining layer 319 is formed using an insulating material on the first electrode 310. The pixel-defining layer 319 is formed so as to expose a predetermined area of the first electrode 310, and an intermediate layer 314 is formed so as to contact the exposed area of the first electrode 310. A second electrode 315 is formed to be connected to the intermediate layer 314.

An encapsulation member (not shown) is disposed on the second electrode 315.

Figure 7:
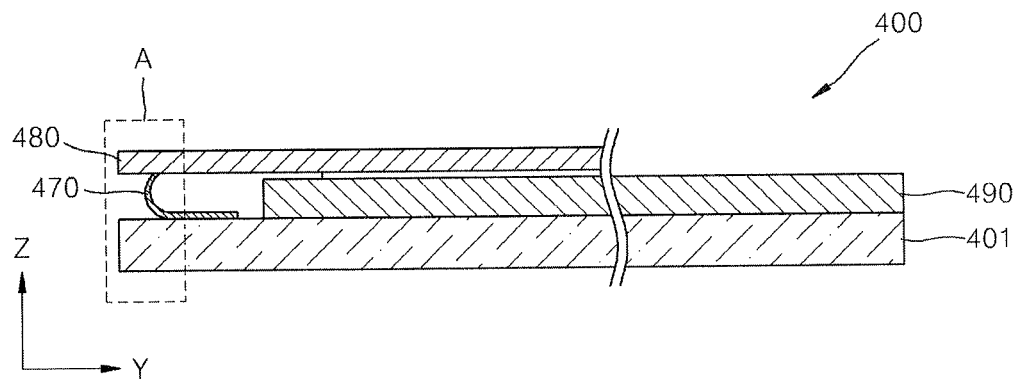
FIG. 7 is a schematic cross-sectional view illustrating a structure of a display apparatus according to another embodiment.
Figure 8:
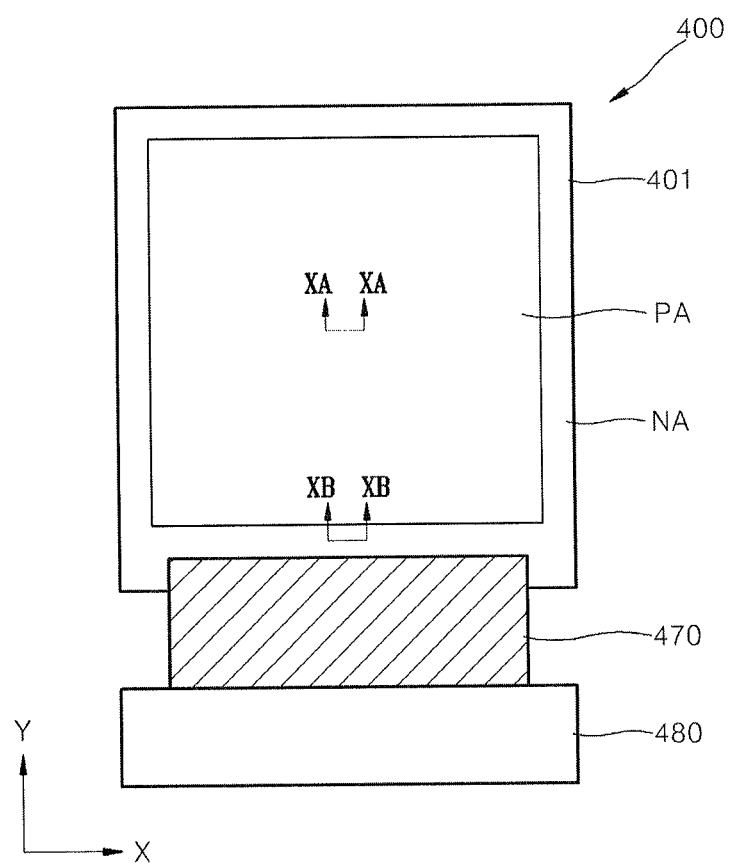
FIG. 8 is a schematic plan view illustrating elements of the display apparatus of FIG. 7, according to an embodiment.
Figure 9:
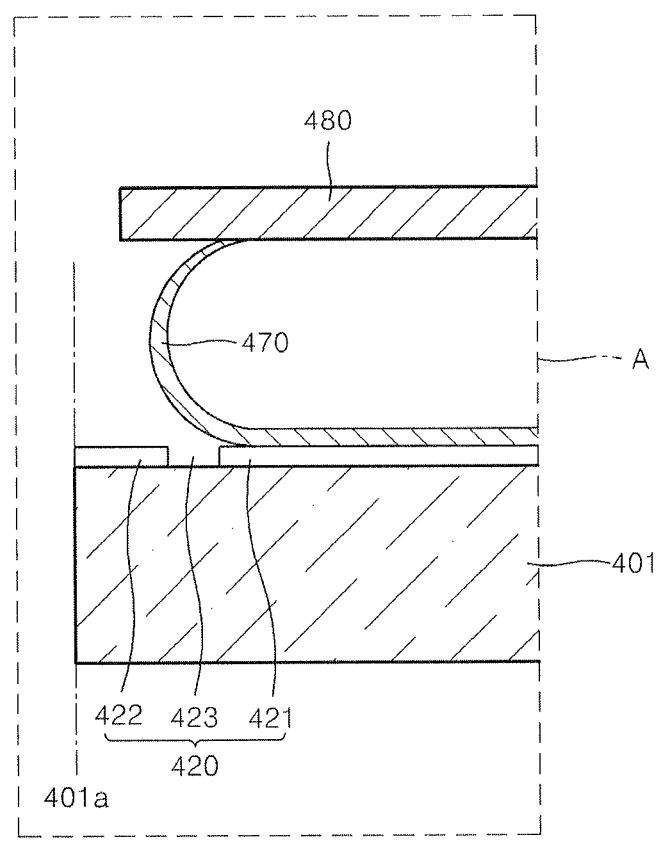
FIG. 9 is an enlarged view of region A illustrated in FIG. 7, according to an embodiment.
Figure 10:
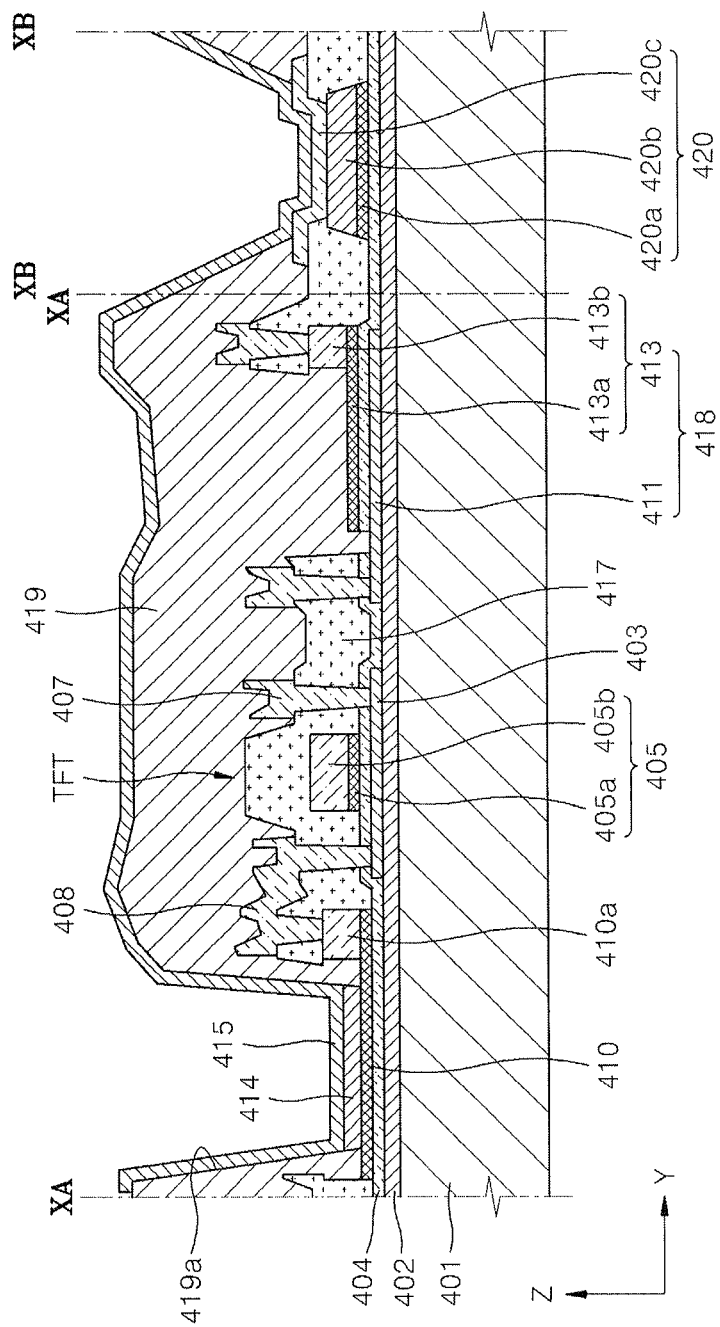
FIG. 10 is a cross-sectional view taken along lines XA-XA and XB-XB of FIG. 8, according to an embodiment.

FIG. 7 is a schematic cross-sectional view illustrating a structure of a display apparatus 400 according to another embodiment. FIG. 8 is a schematic plan view illustrating elements of the display apparatus 400 of FIG. 7, according to an embodiment. FIG. 9 is an enlarged view of region A illustrated in FIG. 7, according to an embodiment. FIG. 10 is a cross-sectional view taken along lines XA-XA and XB-XB of FIG. 8, according to an embodiment.

Referring to FIGS. 7 to 10, the display apparatus 400 includes a substrate 401 including a display area PA, an encapsulation member 490, a pad unit 420, an FPC 470, and a PCB 480.

For the convenience of explanation, elements that are different from those of the display apparatus 100 according to the previous embodiment will now be described in detail.

The display area PA of the substrate 401 is an area for displaying an image. A non-display area NA is formed around the display area PA. The encapsulation member 490 is formed on the substrate 401.

The pad unit 420 is formed on the non-display area NA, as illustrated in FIG. 9. Although not illustrated in the drawings, the pad unit 420 transmits an electrical signal generated by a power supply device (not shown) or a signal supply device (not shown) to the display area PA.

In an embodiment, the pad unit 420 is electrically connected to the FPC 470, and the FPC 470 is connected to the PCB 480. The PCB 480, which has a variety of circuit patterns, may supply a power and generate a variety of signals for driving the display apparatus 400. The electrical signal generated by the PCB 480 is transmitted to the pad unit 420 via the FPC 470, and then transmitted to the display area PA to drive the display area PA.

In particular, the pad unit 420 includes a contact area 421, an exposure area 422, and a disconnection area 423.

The contact area 421 contacts the FPC 470 and is an area through which the signal generated by the PCB 480 is transmitted to the display area PA after passing through the FPC 470. The exposure area 422 is spaced apart from the contact area 421 by the disconnection area 423. That is, the disconnection area 423 is an opening that disconnects the exposure area 422 and the contact area 121. Thus, although not illustrated in the drawings, the exposure area 422 and the contact area 421 are spaced apart from each other on the entire area of the substrate 101.

The FPC 470 electrically connects the contact area 421 and the PCB 480. In particular, a first end of the FPC 470 is connected to the contact area 421 of the pad unit 420 and a second end of the FPC 470 is connected to the PCB 480.

The FPC 470 has a curved shape. That is, as illustrated in FIG. 8, the substrate 401, the FPC 470, and the PCB 480 are connected to one another in this order, the FPC 470 is bent, and the PCB 480 is disposed on a top surface of the encapsulation member 490, i.e., a surface of the encapsulation member 490 that is opposite to a surface of the encapsulation member 490 facing the substrate 401.

The FPC 470 is curved in an upper side direction, i.e., towards the encapsulation member 490, and thus, a side surface of the substrate 401 is not covered by the FPC 470 and is exposed. In addition, the exposure area 422 and the disconnection area 423 of the pad unit 420 are not covered by the FPC 470 and are exposed.

The FPC 470 is formed within an extension line 401*a* of the side surface of the substrate 401. In addition, the PCB 480 connected to the FPC 470 is also formed within the extension line 401*a* of the side surface of the substrate 401. That is, the FPC 470 and the PCB 480 are disposed within the edge of the substrate 401, and thus, the size of the display area PA of the display apparatus 400 may be maintained and the width of the display apparatus 400 may be minimized.

The display area PA and the pad unit 420 will now be described in detail with reference to FIG. 10.

Referring to FIG. 10, a TFT and a capacitor 418 are formed on the display area PA of the substrate 401. The TFT includes an active layer 403, a gate electrode 405, a source electrode 407, and a drain electrode 408.

A buffer layer 402 is formed on the substrate 401. The active layer 403 is formed on the buffer layer 402 to a predetermined size. In addition, a first capacitor electrode 411 is formed on the buffer layer 402. The first capacitor electrode 411 may be formed of the same material as that used to form the active layer 403.

A gate insulating layer 404 is formed on the buffer layer 402 to cover the active layer 403 and the first capacitor electrode 411.

The gate electrode 405, a first electrode 410, and a second capacitor electrode 413 are formed on the gate insulating layer 404.

The gate electrode 405 includes a first conductive layer 405*a* and a second conductive layer 405*b*.

The first electrode 410 may be formed of the same material as that used to form the first conductive layer 405*a* of the gate electrode 405. A conductive part 410*a* is disposed on a predetermined portion of the first electrode 410 and is formed of the same material as that used to form the second conductive layer 405*b* of the gate electrode 405.

The second capacitor electrode 413 includes a first layer 413*a* and a second layer 413*b*. The first layer 413*a* may be formed of the same material as that used to form the first conductive layer 405*a* of the gate electrode 405, and the second layer 413*b* may be formed of the same material as that used to form the second conductive layer 405*b* of the gate electrode 405. The second layer 413*b* may be formed smaller on the first layer 413*a* than the first layer 413*a*. In addition, the second capacitor electrode 413 overlaps with a portion of the first capacitor electrode 411, and may be formed smaller than the first capacitor electrode 411.

A pad unit 420 is formed on the non-display area NA, and a lower layer 420*a* and an upper layer 420*b* of the pad unit 420 are sequentially formed on the gate insulating layer 404 in this order. The lower layer 420*a* and the upper layer 420*b* of the pad unit 420 may be respectively formed of the same materials as those of the first and second conductive layers 405*a* and 405*b* of the gate electrode 405.

An insulating interlayer 417 is formed on the first electrode 410, the gate electrode 405, the second capacitor electrode 413, and the lower and upper layers 420*a* and 420*b* of the pad unit 420. The source electrode 407 and the drain electrode 408 are formed on the insulating interlayer 417. The source and drain electrodes 407 and 408 are formed so as to be connected to the active layer 403.

In addition, the pad unit 420 includes a cover layer 420*c* formed so as to contact the upper layer 420*b* of the pad unit 420. The cover layer 420*c* may be formed of the same material as that used to form the source and drain electrodes 407 and 408.

As illustrated in FIG. 10, one of the areas of the pad unit 420 includes the lower layer 420*a*, the upper layer 420*b*, and the cover layer 420*c*. In one embodiment, the contact area 421 and the exposure area 422 of the pad unit 420 illustrated in FIG. 9, which are formed as a single layer, each may also be formed as three layers, namely, the lower layer 420*a*, the upper layer 420*b*, and the cover layer 420*c*, or two layers, namely, the lower layer 420*a* and the upper layer 420*b*, as illustrated in FIG. 10.

Any one of the source electrode 407 and the drain electrode 408 is electrically connected to the first electrode 410. As an example, as illustrated in FIG. 10, the drain electrode 408 is electrically connected to the first electrode 410. In particular, the drain electrode 408 is electrically connected to the first electrode 410 via the conductive part 410*a*.

A pixel-defining layer 419 is formed on the insulating interlayer 417 so as to cover the source electrode 407, the drain electrode 408, the cover layer 420*c* of the pad unit 420, and the capacitor 418.

The pixel-defining layer 419 is formed so as to have a predetermined opening 419*a* corresponding to a portion of the first electrode 410, and an intermediate layer 414 is formed on the portion of the first electrode 410 that is exposed through the opening 419*a* of the pixel-defining layer 419. The intermediate layer 414 includes an organic EML to emit visible rays.

A second electrode 415 is formed on the intermediate layer 414. In the non-display area NA, the second electrode 415 may be electrically connected to the pad unit 420. That is, the second electrode 415 may contact the cover layer 420*c* of the pad unit 420. In other words, as illustrated in FIG. 9, a first area of the pad unit 420 may be connected to the FPC 470 and a second area of the pad unit 420 may be connected to the second electrode 415. That is, the pad unit 420 of the display apparatus 400 according to the present embodiment may supply a power to the second electrode 415.

Although not illustrated in FIG. 10, an encapsulation member is disposed on the second electrode 415.

Various kinds of display apparatuses may be used. As an example of the display apparatus 400, an organic light-emitting display device including the first electrode 410, the intermediate layer 414 including an organic EML, and the second electrode 415 has been described.

In the display apparatus 400 according to the present embodiment, the FPC 470 is curved in an upper side direction, i.e., towards the encapsulation member 490. In addition, the FPC 470 is formed within the side surface of the substrate 401 by being curved. Accordingly, the size of the display area PA of the display apparatus 400 may be maintained and the width of the display apparatus 400 may be minimized. That is, the width of the non-display area NA around the display area PA may be minimized, and thus, the display apparatus 400 may provide an improved user convenience.

The pad unit 420 of the display apparatus 400 includes the contact area 421 that contacts the FPC 470. In this regard, the contact area 421 is overall spaced apart from the exposure area 422 by the disconnection area 423. The FPC 470 is curved in an upper side direction. If the pad unit 420 were to be exposed to the outside, the pad unit 420 could be damaged by external moisture or serve as a path for permeation of external moisture into the display area PA. In the present embodiment, the exposure area 422 disposed on the edge of the substrate 401 and the contact area 421 that contacts the FPC 470 are overall spaced apart from each other by the disconnection area 423, and thus, even though external moisture permeates into the exposure area 422, the moisture is blocked by the disconnection area 423 to not permeate into the contact area 421. That is, no moisture permeates into the contact area 421, the FPC 470, the display area PA, and the PCB 480. Thus, the permeation of the moisture through the pad unit 420 is easily prevented to easily improve the electrical characteristics of the display apparatus 400.

Figure 11A:
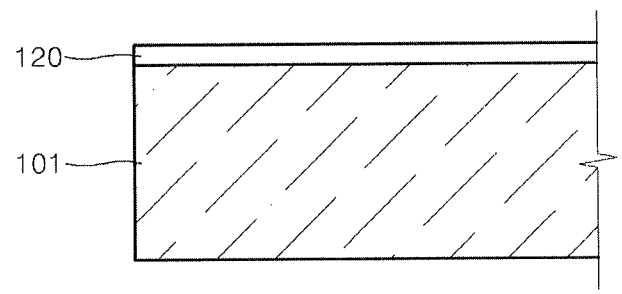
FIGS. 11A through 11C are schematic cross-sectional views sequentially illustrating part of a method of manufacturing the display apparatus of FIG. 1, according to an embodiment.
Figure 11B:
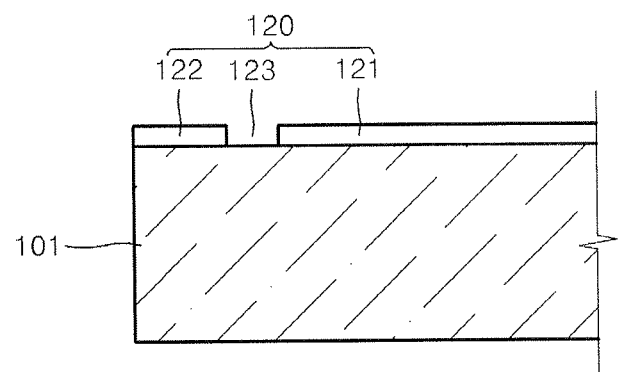
Figure 11C:
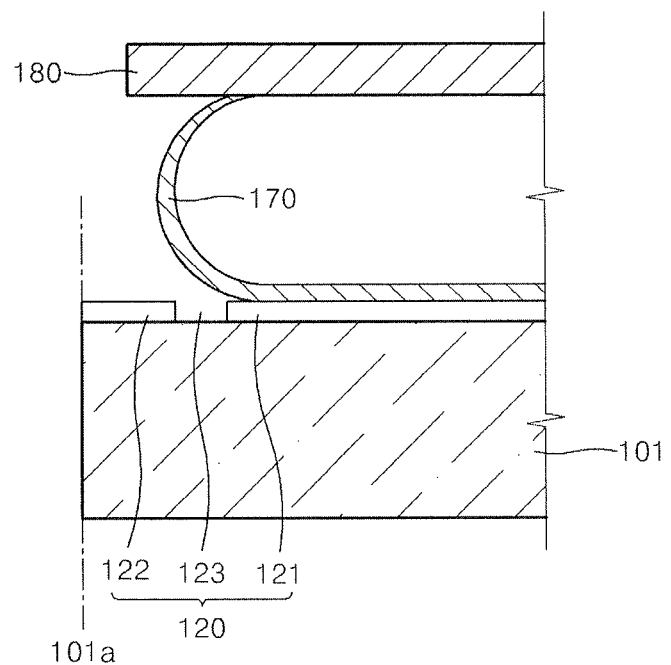

FIGS. 11A through 11C are schematic cross-sectional views sequentially illustrating part of a method of manufacturing the display apparatus 100 of FIG. 1.

In particular, FIGS. 11A through 11C are cross-sectional views illustrating a method of forming the pad unit 120 of the display apparatus 100 of FIG. 1.

Referring to FIG. 11A, first, the pad unit 120 is formed on an entire surface of the substrate 101. That is, the pad unit 120 is formed so as to extend to the edge of the substrate 101. The manufacturing process of the pad unit 120 may be simplified by forming an edge of the pad unit 120 to correspond to an edge of the substrate 101. That is, the edge of the pad unit 120 is disposed to correspond to the edge of the substrate 101, which does not require a separate patterning process.

Then, referring to FIG. 11B, the pad unit 120 is processed so as to form the contact area 121, the exposure area 122, and the disconnection area 123. For example, a cutting process, such as laser cutting using laser beams, is performed on the pad unit 120 to form the disconnection area 123, and accordingly, the contact area 121 and the exposure area 122 that are spaced apart from each other by the disconnection area 123 may be easily formed.

The disconnection area 123 may be formed by the cutting process. Accordingly, side surfaces of the contact area 121 and the exposure area 122 which face each other, i.e., side surfaces of the contact area 121 and the exposure area 122, each of which faces the disconnection area 123, may be formed as cutting surfaces.

Then, referring to FIG. 11C, the FPC 170 is connected to the contact area 121, and the PCB 180 is connected to the FPC 170. The FPC 170 is curved in an upper side direction, i.e., in a direction away from the substrate 101 so that a side surface of the substrate 101 is exposed and the FPC 170 and the PCB 180 are formed within (on an inner side of) the extension line 101a of the side surface of the substrate 101.

In the present embodiment, the edge of the pad unit 120 is formed to correspond to the edge of the substrate 101, and thus, the convenience of the manufacturing process is improved. In addition, the disconnection area 123 is formed by the cutting process, such as laser cutting, so as to form space between the contact area 121 and the exposure area 122. Therefore, the permeation of external moisture through the pad unit 120 may be easily prevented to easily improve the electrical characteristics of the display apparatus 100.

By way of summation and review, a pad unit may include a plurality of wires and may be disposed on an edge of a flat panel display device. Thus, a pad unit may be easily damaged by external moisture and may act as a path for the permeation of moisture into a display area of the flat panel display device. Accordingly, there may be a limitation on improving electrical characteristics of display apparatuses.

In addition, an FPC may be disposed at a side of the flat panel display device, and thus, may unnecessarily occupy an area outside an effective area for display an image of the flat panel display device. Thus, there may be a limitation on providing user convenience.

In contrast, according to the one or more embodiments, a display apparatus provides an improved user convenience and an improved electrical characteristic. In addition, a method of manufacturing the display apparatus may lead to such effects.

While the present invention has been particularly shown and described with reference to exemplary embodiments thereof, it will be understood by those of ordinary skill in the art that various changes in form and details may be made therein without departing from the spirit and scope as defined by the following claims.

What is claimed is:

1. A display apparatus comprising:
   a substrate including a display area;
   an encapsulation member facing the substrate;
   a pad unit around the display area of the substrate, the pad unit including a contact area and an exposure area that is spaced apart from the contact area; and
   a flexible printed circuit (FPC) that is connected to the contact area of the pad unit and is curved towards the encapsulation member.

2. The display apparatus of claim 1, wherein a disconnection area is arranged between the contact area and the exposure area of the pad unit such that the contact area is spaced apart from the exposure area.

3. The display apparatus of claim 1, wherein the contact area is farther away from an edge of the substrate than the exposure area.

4. The display apparatus of claim 1, wherein the exposure area is spaced apart from the FPC and in a non-overlapping relationship with the FPC.

5. The display apparatus of claim 1, wherein side surfaces of the contact area and the exposure area, which face each other, are in a form of cutting surfaces.

6. The display apparatus of claim 1, further comprising a printed circuit board (PCB) that is connected to the FPC and faces the encapsulation member.

7. The display apparatus of claim 6, wherein the PCB is within an extension line of a side surface of the substrate.

8. The display apparatus of claim 1, wherein the FPC is within an extension line of a side surface of the substrate.

9. The display apparatus of claim 1, wherein an edge of the exposure area is parallel to an edge of the substrate.

10. The display apparatus of claim 1, wherein at least one of the contact area and the exposure area of the pad unit is in a form of multi-layers.

11. The display apparatus of claim 1, wherein at least a first electrode, a second electrode, and an intermediate layer that is between the first electrode and the second electrode and that includes an organic emission layer, are on the display area of the substrate.

12. The display apparatus of claim 11, further comprising a thin film transistor that is electrically connected to the first electrode and that includes an active layer, a gate electrode, a source electrode, and a drain electrode.

13. The display apparatus of claim 11, further comprising a thin film transistor that is electrically connected to the first electrode and that includes an active layer, a gate electrode, a source electrode, and a drain electrode, wherein the first electrode is at a same layer level as the gate electrode.

14. The display apparatus of claim 13, wherein at least one of the contact area and the exposure area of the pad unit is in a form of multi-layers, wherein at least one of the multi-layers is at the same layer level as the gate electrode, and at least another layer of the multi-layers is on a same layer level as the source electrode and the drain electrode so as to contact a layer at the same layer level as the gate electrode.

* * * * *